United States Patent
Yang et al.

(10) Patent No.: US 10,305,792 B2
(45) Date of Patent: May 28, 2019

(54) NETWORK DETECTION METHOD AND CONTROLLER USING THE METHOD

(71) Applicant: CLOUD NETWORK TECHNOLOGY SINGAPORE PTE, LTD., Singapore (SG)

(72) Inventors: Kai-Yu Yang, New Taipei (TW); Bo-Run Shao, New Taipei (TW); Hao-Wen Chung, New Taipei (TW)

(73) Assignee: Cloud Network Technology Singapore Pte. Ltd., Singapore (SG)

( * ) Notice: Subject to any disclaimer, the term of this patent is extended or adjusted under 35 U.S.C. 154(b) by 486 days.

(21) Appl. No.: 15/074,184

(22) Filed: Mar. 18, 2016

(65) Prior Publication Data

US 2016/0337188 A1  Nov. 17, 2016

(30) Foreign Application Priority Data

May 14, 2015  (TW) .............................. 104115357 A

(51) Int. Cl.
*H04L 12/24* (2006.01)
*H04L 12/721* (2013.01)
*H04L 12/771* (2013.01)
*H04L 12/26* (2006.01)
*H01L 41/12* (2006.01)
*H04L 12/715* (2013.01)

(52) U.S. Cl.
CPC .............. *H04L 45/56* (2013.01); *H01L 41/12* (2013.01); *H04L 43/0817* (2013.01); *H04L 43/0894* (2013.01); *H04L 43/106* (2013.01); *H04L 45/64* (2013.01)

(58) Field of Classification Search
CPC ..... H04L 45/56; H04L 41/12; H04L 43/0817; H04L 43/0894; H04L 43/106; H04L 45/64
See application file for complete search history.

(56) References Cited

U.S. PATENT DOCUMENTS

| | | | |
|---|---|---|---|
| 6,262,976 B1 * | 7/2001 | McNamara | H04L 45/00 370/254 |
| 8,724,503 B2 * | 5/2014 | Johnsson | H04L 43/50 370/230 |
| 8,750,158 B2 * | 6/2014 | Morrill | H04M 15/00 370/253 |
| 8,773,992 B2 * | 7/2014 | Lai | H04L 45/04 370/230.1 |
| 9,998,392 B1 * | 6/2018 | Allen | H04L 47/70 |
| 2008/0144511 A1 * | 6/2008 | Marcondes | H04L 45/00 370/236 |

(Continued)

FOREIGN PATENT DOCUMENTS

| CN | 102480753 A | 5/2012 |
|---|---|---|
| CN | 102325060 B | 11/2013 |

*Primary Examiner* — Un C Cho
*Assistant Examiner* — Bailor C. Hsu
(74) *Attorney, Agent, or Firm* — ScienBiziP, P.C.

(57) ABSTRACT

A network detection method links multiple nodes residing in a network topology to form multiple edges and creates snake paths through the edges using a snake algorithm. The routing frequencies of each of the snake paths is calculated, and software-defined network (SDN) policy flows to each of the nodes are produced and applied. The health and performance status, and available bandwidths, of the snake paths are dynamically detected via packet flows using a pathChirp bandwidth detection method.

15 Claims, 11 Drawing Sheets

(56) References Cited

U.S. PATENT DOCUMENTS

| | | | |
|---|---|---|---|
| 2011/0158095 A1* | 6/2011 | Alexander | H04L 47/805 370/232 |
| 2012/0087377 A1 | 4/2012 | Lai | |
| 2012/0196644 A1* | 8/2012 | Scherzer | H04W 48/18 455/524 |
| 2012/0327816 A1 | 12/2012 | Morrill et al. | |
| 2014/0075452 A1* | 3/2014 | Supalov | G06F 9/5066 719/313 |
| 2014/0149542 A1* | 5/2014 | Luo | H04L 45/02 709/217 |

\* cited by examiner

| Health Value | CFL |
|---|---|
| 1 | L1 |
| 2 | L2 |
| 3 | L3 |
| ≧4 | L4 |

FIG. 9A

| CFL | Routing Frequency |
|---|---|
| 1 | T |
| 2 | T+△ |
| 3 | T+2*△ |
| ≧4 | T+3*△ |

FIG. 9B

NETWORK DETECTION METHOD AND CONTROLLER USING THE METHOD

FIELD

The present disclosure generally relates to a network detection method based on software-defined networking (SDN) and controller using the method.

BACKGROUND

Software-Defined Networking (SDN) is a network organizing technique. An SDN with an OpenFlow protocol separates the data and control functions of networking devices, such as routers, packet switches, and LAN switches, by inserting a well-defined Application Programming Interface (API) between the two. In many large enterprise networks, routers and other network devices encompass both data and control functions, making it difficult to adjust the network infrastructure and operation to large-scale addition of enduser systems, virtual machines, and virtual networks.

In a hybrid SDN, engineers can run SDN technologies and standard switching protocols simultaneously on the physical hardware. A network manager can configure the SDN control plane to discover and control certain traffic flows while traditional, distributed networking protocols continue to direct the rest of the traffic on the network.

Under the hybrid network including SDN and legacy switches, when a network or network devices needs to be diagnosed, an SDN controller sends checking requests to the switches for network diagnosis. However, the network or the network devices can be heavily loaded by frequent checking when the sending of KeepAlive packets via the SDN controller is persistent, and errors cannot be immediately discovered.

In addition, the SDN controller needs extra packets, for example, pathChirp packets for checking of network state information, for example, bandwidth information. Therefore, the more switches being managed by the SDN controller, the more loadings the SDN controller will get.

BRIEF DESCRIPTION OF THE DRAWINGS

Implementations of the present technology will now be described, by way of example only, with reference to the attached figures.

FIG. 9A illustrates a diagrammatic view of relationships between health scores and CFLs; and FIG. 9B illustrates a diagrammatic view of relationships between CFLs and routing frequencies.

DETAILED DESCRIPTION

Figure 1:
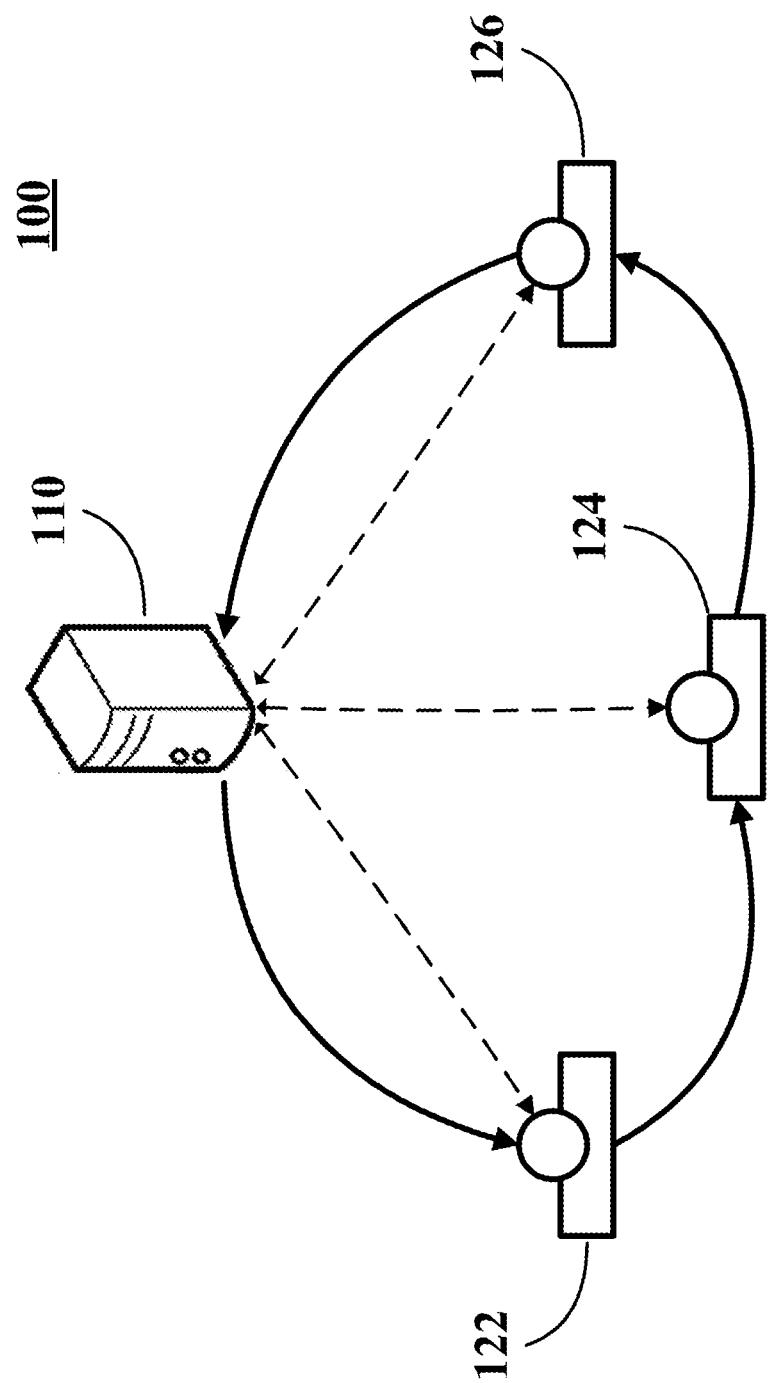
FIG. 1 illustrates a diagrammatic view of an embodiment of a network detection system.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

References to "an" or "one" embodiment in this disclosure are not necessarily to the same embodiment, and such references mean "at least one."

In general, the word "module" as used hereinafter, refers to logic embodied in computing or firmware, or to a collection of software instructions, written in a programming language, such as, Java, C, or assembly. One or more software instructions in the modules may be embedded in firmware, such as in an erasable programmable read only memory (EPROM). The modules described herein may be implemented as either software and/or computing modules and may be stored in any type of non-transitory computer-readable medium or other storage device. Some non-limiting examples of non-transitory computer-readable media include CDs, DVDs, BLU-RAY, flash memory, and hard disk drives. The term "comprising", when utilized, means "including, but not necessarily limited to"; it specifically indicates open-ended inclusion or membership in a so-described combination, group, series and the like.

FIG. 1 illustrates an embodiment of a network detection system 100. The network detection system 100 comprises at least one SDN controller 110 and network devices 122, 124, and 126.

The SDN controller creates routing paths, also known as snake paths, of the network devices 122, 124, and 126 within a network topology using a snake algorithm. Routing frequencies of each of the routing paths are calculated according to levels of frequency checking (CFLs) of each of the routing paths. Further, the SDN controller 110 transmits probe packets along each of the routing paths, and analyzes information as to remaining bandwidth and as diagnostic information of each of the routing paths, according to the returned probe packets.

In an embodiment, the network devices may be, but are not limited to being, switches.

Figure 2:
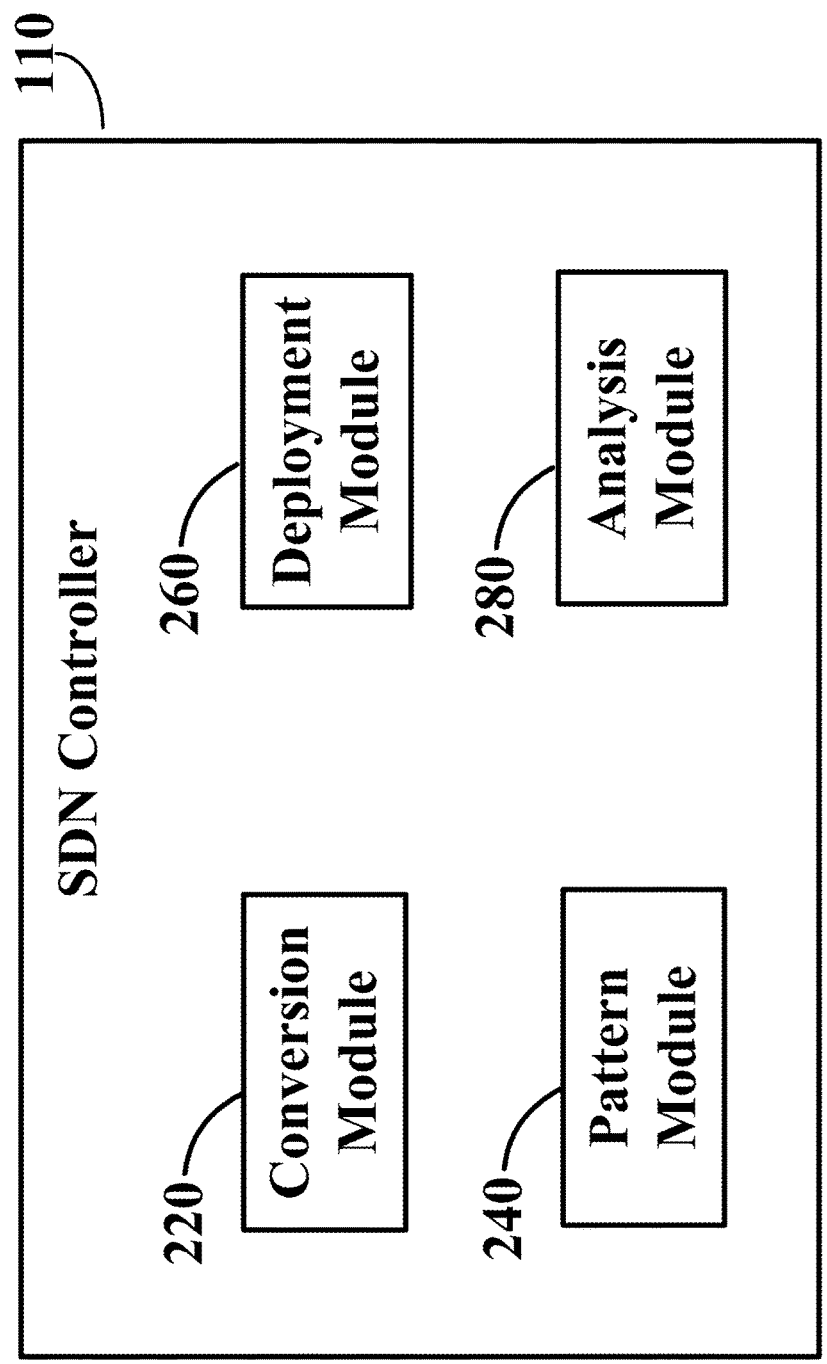
FIG. 2 illustrates a block diagram of an embodiment of function modules an SDN controller.

FIG. 2 illustrates an SDN controller 110. The SDN controller 110 comprises a conversion module 220, a pattern module 240, a deployment module 260, and an analysis module 280.

The one or more function modules can include computerized code in the form of one or more programs that are stored in a storage unit (not shown), and executed by a processor (not shown) to provide functions of the network detection system 100. The storage unit (not shown) can be a dedicated memory, such as an EPROM, or a flash memory.

The conversion module 220 links multiple network devices residing in a network topology to form multiple snake edges. Quantization of network data of the snake edges to obtain network state scores is implemented, and the network state scores are converted to CFLs corresponding to the snake edges.

The pattern module 240 links multiple network devices and snake edges to create multiple snake paths, according to the CFLs, using the Snake algorithm, and calculates routing frequencies of the routing paths according to the CFLs of each of the snake edges.

The deployment module 260 translates the routing paths and the routing frequencies to a policy flow and applies the policy flow to each of the network devices, for examples to the switches, according to the OpenFlow protocol.

The analysis module 280 dynamically detects states of health and available bandwidth of the routing paths according to packet flows using the pathChirp algorithm.

Figure 3:
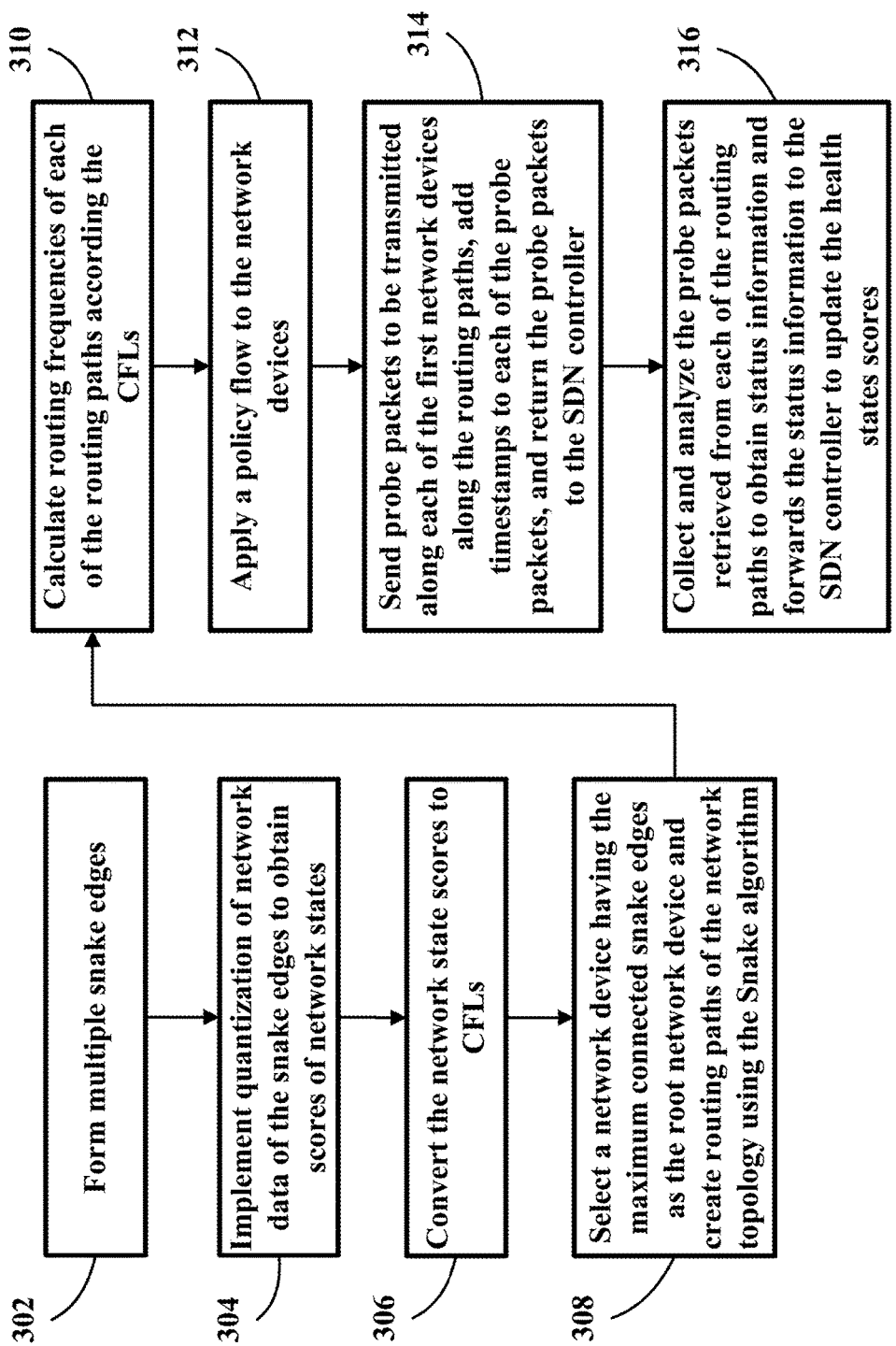
FIG. 3 illustrates a flowchart of an embodiment of a network detection method.

FIG. 3 illustrates a network detection method.

Referring to FIG. 3, a flowchart is presented in accordance with an example embodiment of a network detection method 300 for the network detection system. The network detection method 300 is provided by way of example, as there are a variety of ways to carry out the method. The method 300 described below can be carried out using the configurations illustrated in FIG. 2, for example, and various elements of these figures are referenced in explaining the method 300. Each block shown in FIG. 3 represents one or more processes, methods, or subroutines, carried out in the method 300. Additionally, the illustrated order of blocks is by example only and the order of the blocks can change. The method 300 can begin at 302.

At block 302, the conversion module 220 links multiple network devices, for example the switches residing in a network topology, to form multiple snake edges.

At block 304, the conversion module 220 implements quantization of network data of the snake edges to obtain scores for network states, scores according to multiple factors. The factors comprise at least critical paths, reliabilities, failure rates, available bandwidth, and latencies.

Figure 4:
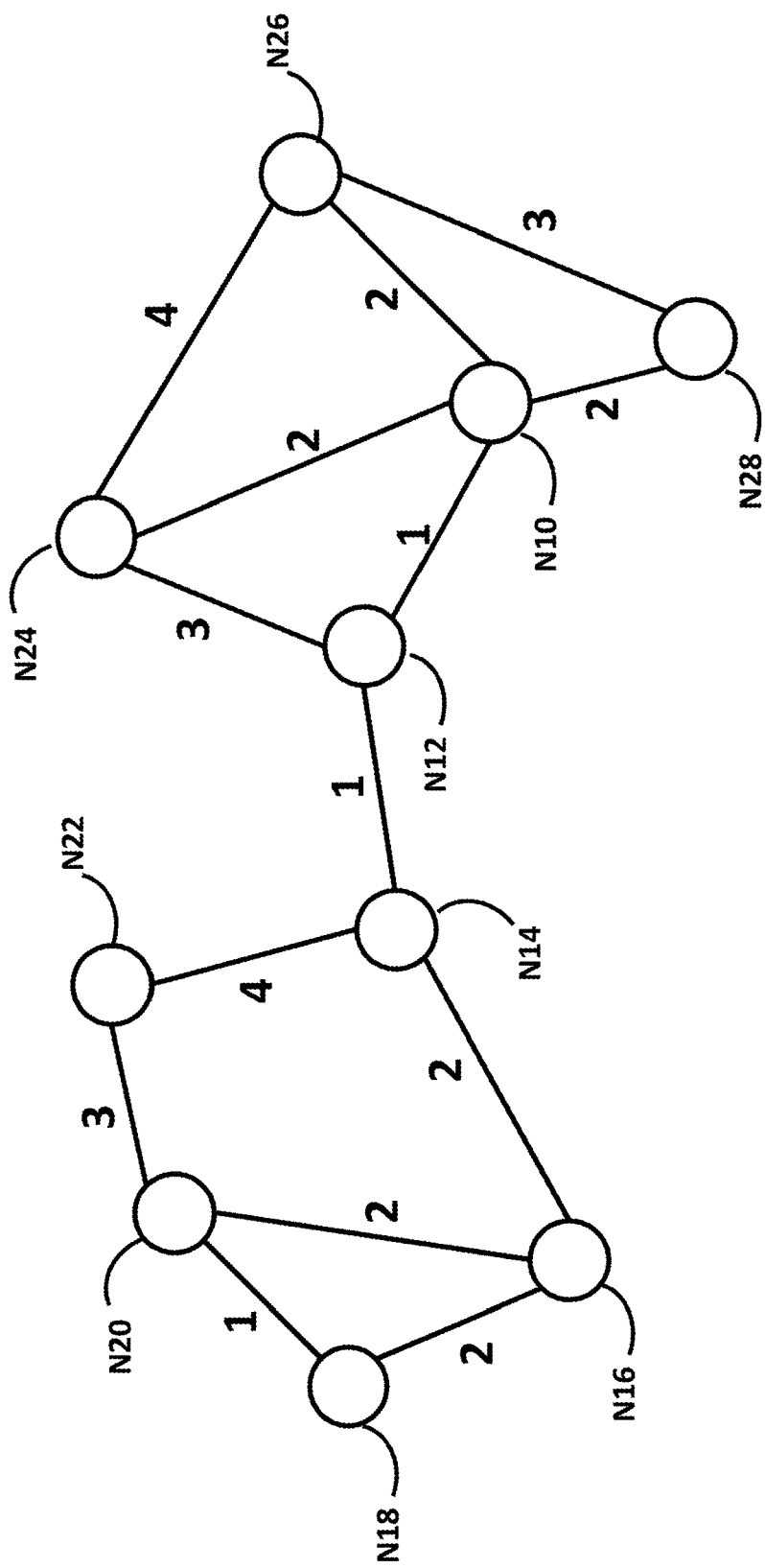
FIG. 4 illustrates a diagrammatic view of an embodiment of checking frequency levels (CFL) of edges.

At block 306, the conversion module 220 converts the network state scores to CFLs corresponding to the snake edges, as shown in FIG. 4.

When one of the snake edges is a critical edge, the health value assigned thereto as is 1 (Health Value=1). If not a critical edge, the CFL thereof is calculated using other factors. The equation to calculate the CFLs is represented as:

Health Value=Reliability*α+(Failure Rate)*β+(Available Bandwidth)*γ+Latency*δ, where α, β, γ and δ can be dynamically adjusted. FIG. 9A illustrates a diagrammatic view of relationships between health scores and CFLs.

At block 308, the pattern module 240 selects a network device, for example, the network device N10, having the maximum number of connected snake edges, as the root network device, and creates overall routing paths of the network topology using the Snake algorithm.

Figure 5:
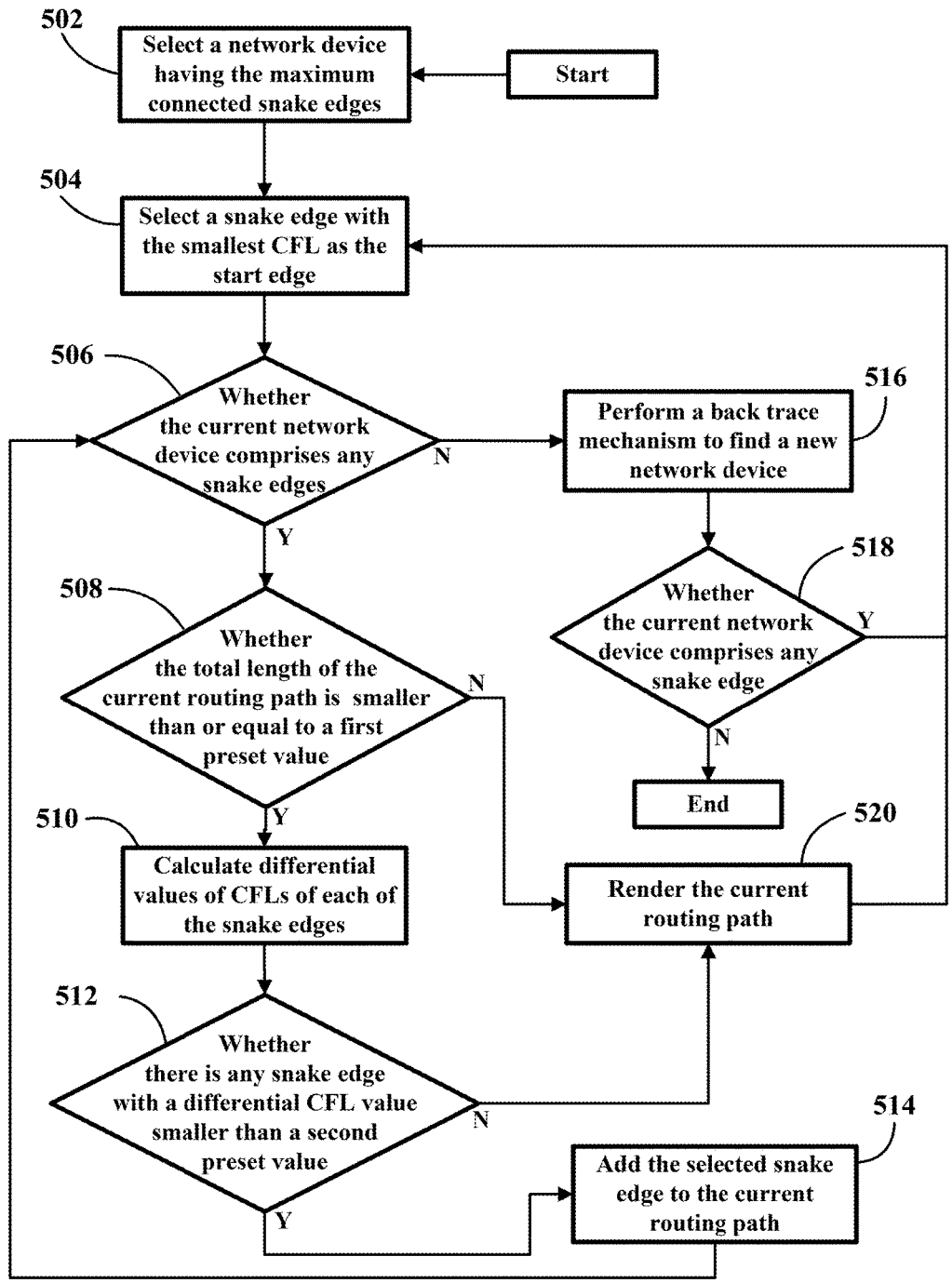
FIG. 5 illustrates a flowchart of an embodiment of a network detection method.

Referring to FIG. 5, a flowchart of a further method (network detection method 500) for the network detection system is presented in accordance with an example embodiment of a network detection method 500 for the network detection system. The network detection method 500 is provided by way of example, as there are a variety of ways to carry out the method. The method 500 described below can be carried out using the pattern module 240 illustrated in FIG. 2, for example, and various elements of these figures are referenced in explaining the processing method 500. Each block shown in FIG. 5 represents one or more processes, methods, or subroutines, carried out in the exemplary method 500. Additionally, the illustrated order of blocks is by example only and the order of the blocks can change. The method 500 can begin at 502.

At block 502, a network device, for example network device N10 having the maximum number of connected snake edges, is selected as the root network device.

Figure 6A:
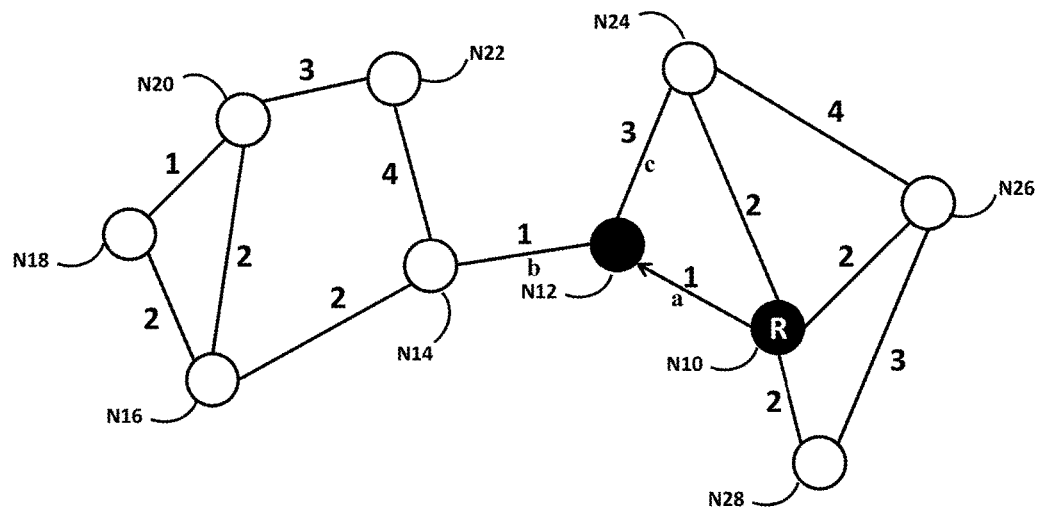
FIGS. 6A-F illustrate diagrammatic views of an embodiment of the creation of a routing path.

At block 504, a snake edge with the smallest CFL is selected as the start edge and the process is moved to the next network device. The snake edge (CFLa=1), for example that snake edge connecting the network device N10 and the network device N12, is designated as the start edge, as shown in FIG. 6A. When the process moves to the next step, the current network device is changed from the network device N10 to the network device N12, where the total length of the current routing path is 1. The length N of the routing path indicates moving steps between the network devices in the network topology.

At block 506, it is determined whether the current network device, for example network device N12, comprises any snake edges.

At block 508, if the current network device, for example network device N12, comprises at least one snake edge, it is determined whether the total length of the current routing path is smaller than or equal to a first preset value, for example, 14 ($E_{snake} \leq 14$).

At block 510, when the total length of the current routing path is smaller than or equal to a first preset value, the CFLs of each unused snake edge of the current network device, for example the network device N12, are calculated. A calculation is also made as to the differential values between the CFLs of unused snake edges and the CFL of the snake edge connecting the current network device (N12), and for example the same values in relation to network device N10 which is prior to the current network device N12.

Figure 6B:
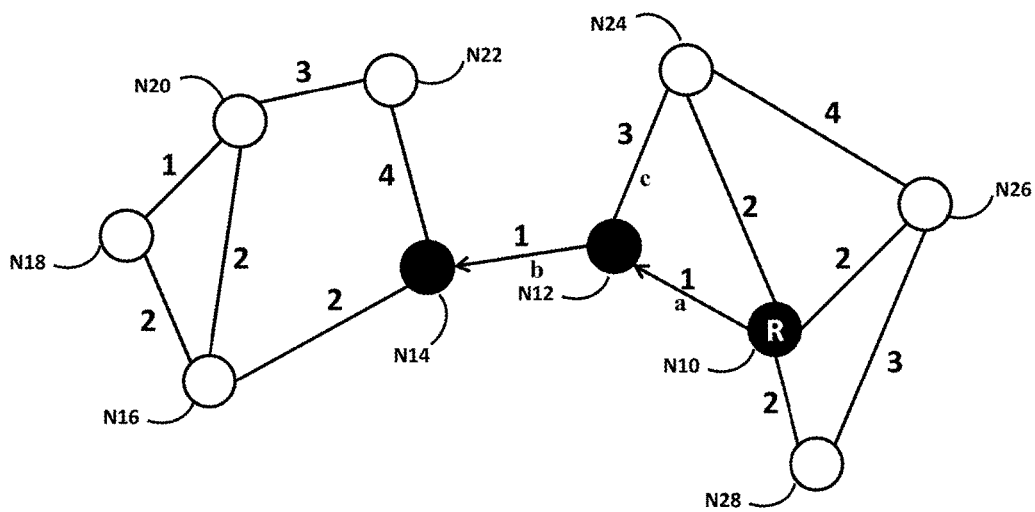

Referring to FIG. 6B, the network device N12 comprises two unused snake edges b and c, where CFLb=1 and CFLc=3. The differential values between the snake edges b and c of the network device N12 and the snake edge a of the network device N10 can be represented as:

$|CFLa-CFLb|=|1-1|=0;$ and $|CFLa-CFLc|=|1-3|=2.$

At block 512, it is determined whether there is any snake edge with a differential CFL value smaller than a second preset value, for example, 1 ($|CFL_{max}-CFL_{next}| \leq 1$).

At block 514, if there is at least one snake edge with a differential CFL value smaller than the second preset value, for example the snake edge b shown in FIG. 6B, the snake edge b is added to the current routing path and the process moves to the next network device. Thus, the current network device can be and is changed from the network device N12 to the network device N14, where the total length of the current routing path is 2.

Figure 6C:
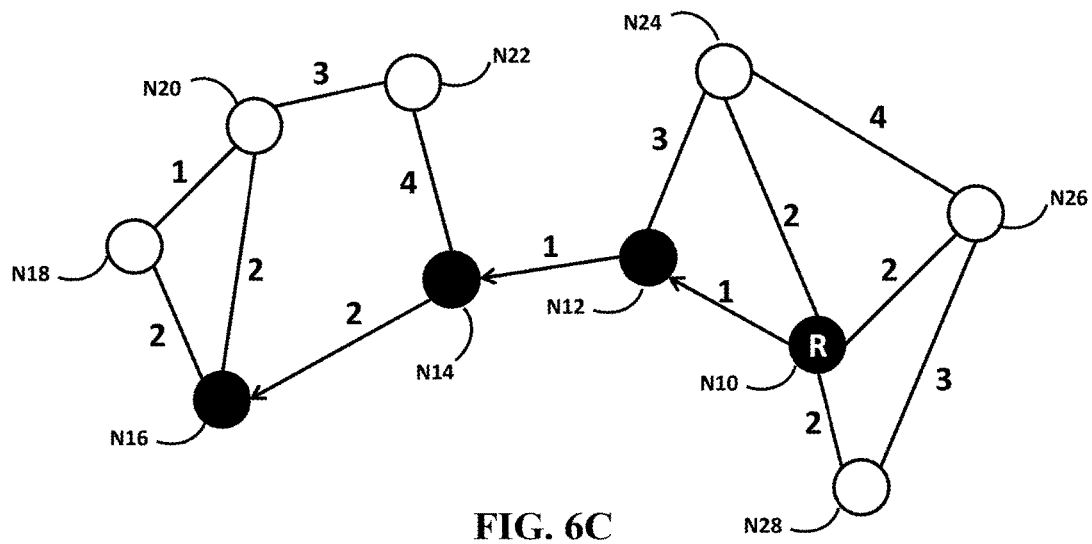
Figure 6D:
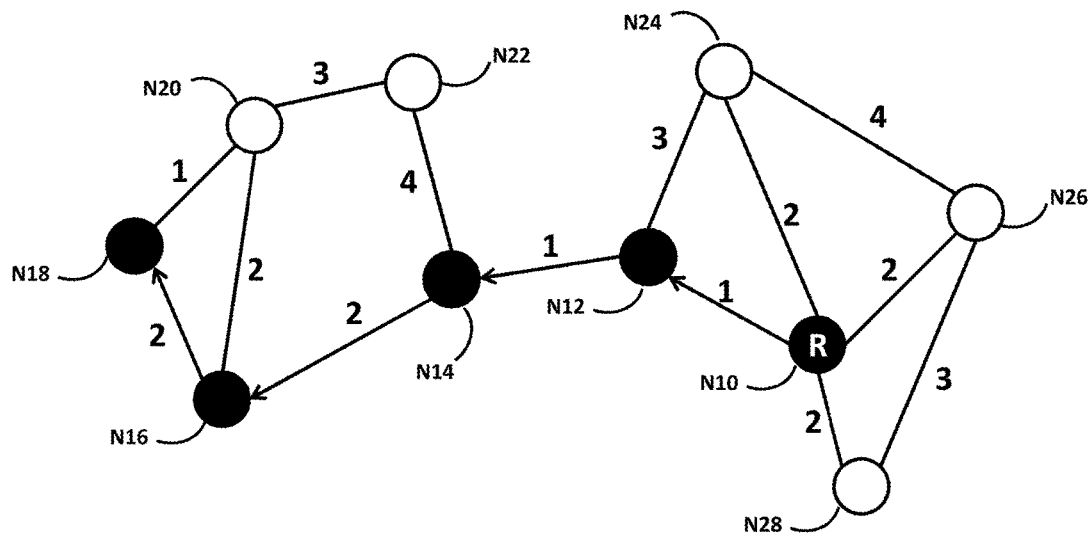
Figure 6E:
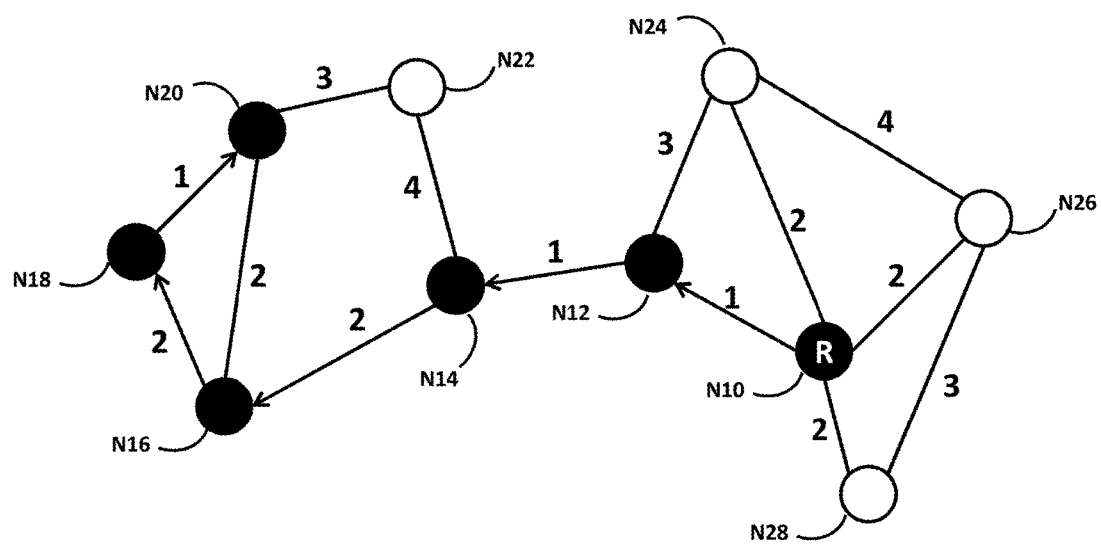

The process returns to the block 506 to repeat blocks 506-514 until there are no snake edges with the differential CFL values smaller than 1 or until the total length of the current routing path is greater than the first preset value, 14 ($E_{snake}>14$ or $|CFL_{max}-CFL_{next}|>1$), as shown in FIGS. 6C-E.

When there is more than one snake edge having a differential CFL value greater than 1, one snake edge is randomly selected for the process.

Figure 6F:
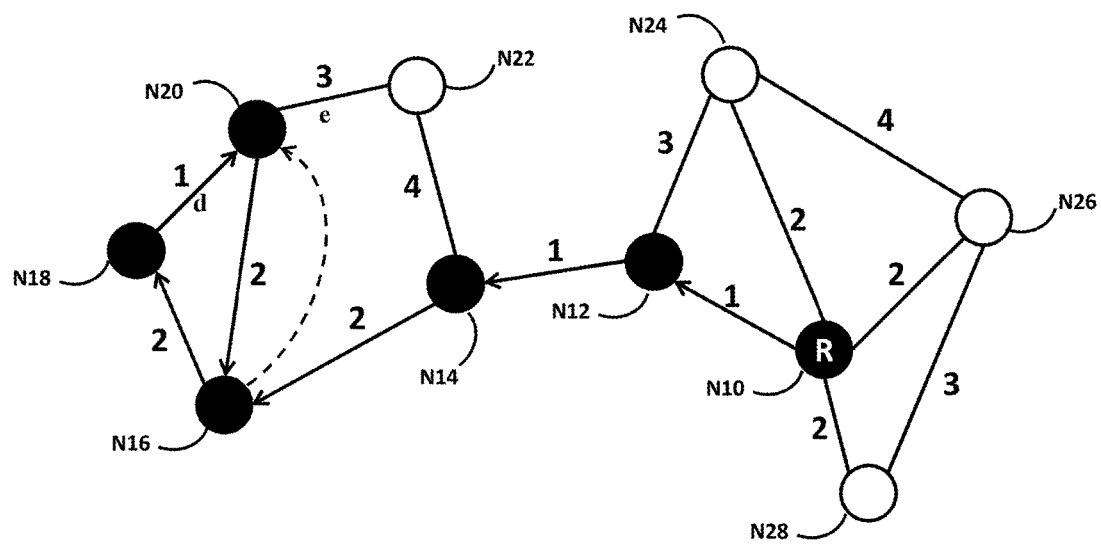
Figure 7A:
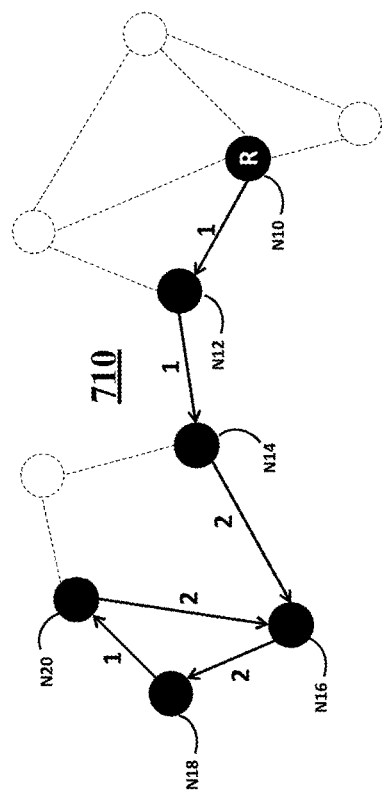
FIGS. 7A-D illustrate diagrammatic views of an embodiment of routing paths created using the network detection method.
Figure 7B:
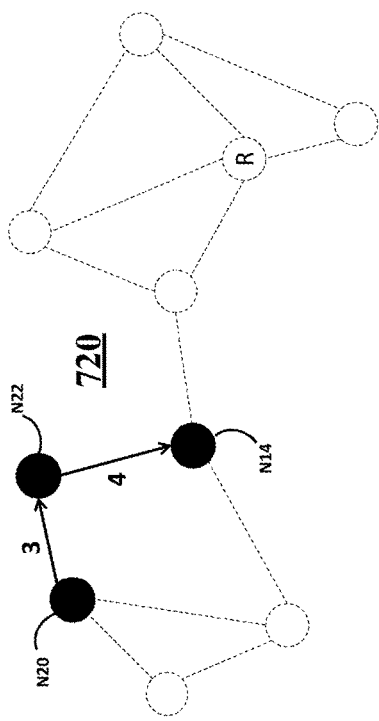
Figure 7C:
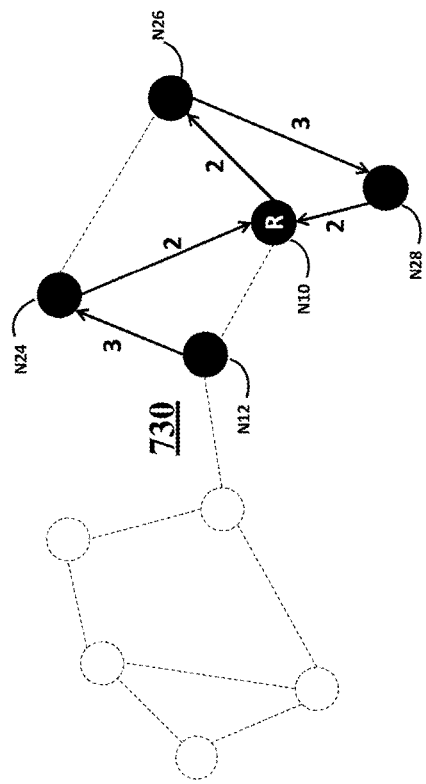
Figure 7D:
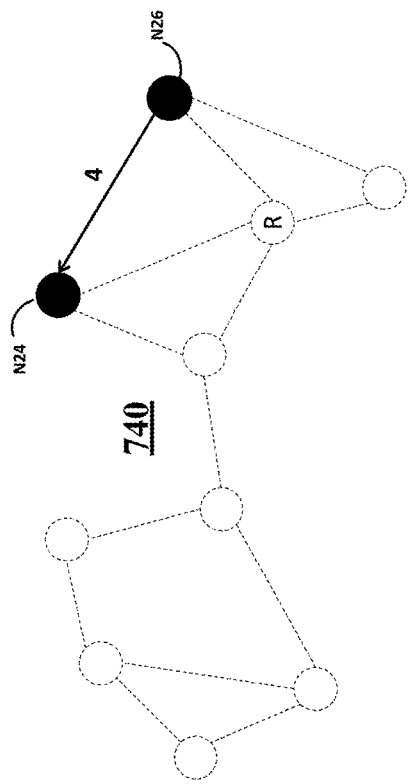

At block 516, if the current network device, for example network device N16, comprises no snake edge, a back trace mechanism is performed to find a new network device. As shown by the dotted arrow in FIG. 6F, network device N20 is discovered via the back trace mechanism. Thus, the current network device can be and is changed from the network device N16 to the network device N20.

At block 518, it is determined whether the current network device, for example N20, comprises any snake edge.

If the current network device (N20) comprises at least one snake edge, the process returns to block 504. In this case, the current network device acts as the start network device and the foregoing operations are repeated to create another routing path. Otherwise, the process is terminated when the current network device (N20 for example), does not comprise any snake edge.

At block 520, if the total length of the current routing path is greater than the first preset value (14), the current routing path is rendered. The process then returns to block 504, the current network device acts as the starting network device, and the foregoing operations are repeated to create another routing path.

From block 512, if there is no snake edge with a differential CFL value smaller than the second preset value, 1, the process proceeds to block 520 in order that the current routing path is rendered.

As shown by the network topology in FIG. 4, after the FIG. 5 method is completed, four routing paths are created. These comprise the first routing path 710, the second routing path 720, the third routing path 730, and the fourth routing path 740, as shown in FIGS. 7A-D.

At block 310, the pattern module 240 calculates routing frequencies of each of the routing paths according to the CFLs.

The routing frequency indicates time intervals within CFLs of a routing path, which is defined based on the smallest CFL of the routing path. FIG. 9B illustrates a diagrammatic view of relationships between CFLs and routing frequencies, where the parameters T and A are adjustable and are both predetermined as, for example, 10 seconds.

In contrast to health diagnosis under the legacy or SDN network, the method of the present disclosure can improve network performance by visiting the overall routing paths of the network topology.

At block 312, the deployment module 260 infers a policy flow based on the created routing paths and the OpenFlow protocol using the pathChirp algorithm and applies the policy flow to the OpenFlow-standard network devices, for example, the switches.

At block 314, the deployment module 260 sends probe packets to be transmitted along each of the routing paths. The network devices, for example, the switches, residing in each of the routing paths add timestamps to each of the probe packets. The last network devices of each of the routing paths return the probe packets to the analysis module 280.

At block 316, the analysis module 280 collects and analyzes the probe packets retrieved from each of the routing paths to obtain information as to status, such information at least comprising available bandwidth, network latencies, and communication qualities, and forwards the status information to the conversion module 220 to update the health states scores of the network topology.

Figure 8:
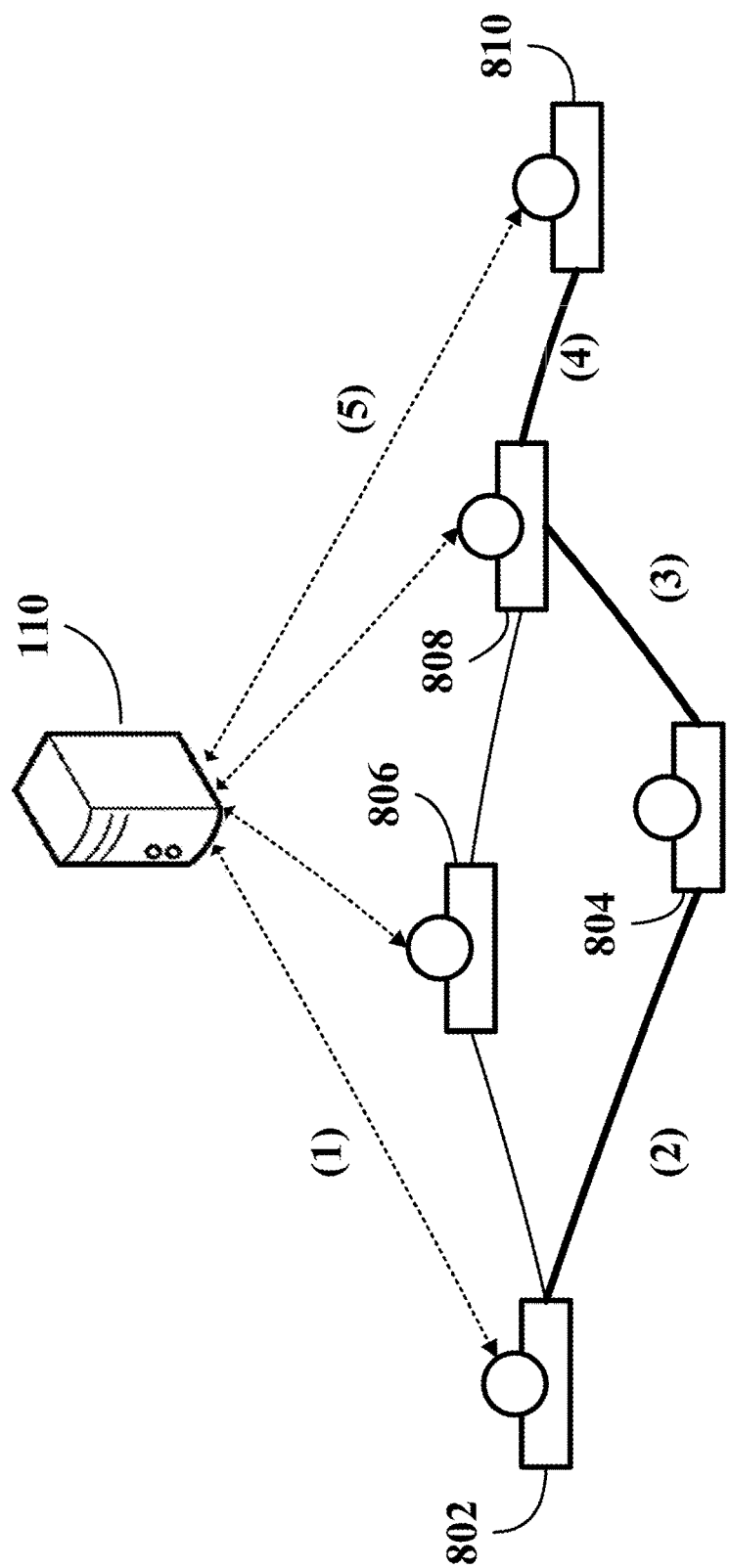
FIG. 8 illustrates a workflow of an embodiment of a deployment module.

FIG. 8 illustrates a workflow of an embodiment of the deployment module 260.

The deployment module 260 sends a probe packet to a switch 802 residing in a routing path (step (1)). When the probe packet reaches the switch 802, the switch 802 analyzes the probe packet according to SDN policy and adds a timestamp to the probe packet indicating the packet visiting time, and forwards the probe packet to a switch 804 via an SDN flow (step (2)). When the probe packet reaches a switch 810 via a switch 808 (steps (3) and (4)), the switches 810 adds a timestamp to the probe packet and returns the probe packet to the SDN controller 110 (step (5)).

The embodiments shown and described above are only examples. Many details are often found in the art such as the other features of a network detection system. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A network detection method, executable by a processor of a controller, the method comprising:
  linking multiple network devices residing in a network topology to form multiple edges;
  implementing quantization to network data of the edges to obtain network state scores;
  converting the network state scores to check frequency levels (CFLs) corresponding to the edges;
  selecting a first network device comprising the maximum connected edges as a start network device;
  creating multiple routing paths comprise at least one first routing path, wherein the first routing path comprises multiple first network devices from the network devices and multiple first edges from the edges;
  calculating routing frequency of the first routing path according to first CFLs of the first edges;
  inferring a policy flow based on the first routing path and the OpenFlow protocol using a pathChirp algorithm and applying the policy flow to the first network devices;
  transmitting a probe packet on the first routing path and adding timestamps to the probe packet by the first network devices;
  returning the probe packet to the controller via the last network device;
  collecting probe packets returned along the first routing path and analyzing the probe packets to obtain health states of the first routing path for network data update;
  selecting a second network device comprising the maximum connected edges;
  selecting a second edge from the edges connected to the second network as a start edge and moving to a third network device; wherein a second CFL of the second edge is less than a specific value, wherein the second edges is added to form a second routing path;
  determining whether the third device comprises any edge;
  determining whether the total length of the second routing path is less than or equal to a first preset value when the third device comprises at least one edge;
  calculating CFLs of unused edges of the third network device, if the total length of the second routing path is less than or equal to the first preset value, and calculating differential values between the CFLs of the unused edges and the CFL of a selected edge connecting the third network device and the network device prior to the third network device;

determining whether there is an edge with its differential value less than a second preset value for the third network;
if there is a third edge with its differential value less than the second preset value for the third network, adding the third edge to the second routing path and moving to a fourth network device; and
repeating the above steps until there is no edge with its differential value less than the second preset value or the total length of the second routing path is greater than the first preset value, and rendering the second routing path.

2. The method as claimed in claim 1, wherein the selecting step further comprises:
performing a recall process to discover a fourth network device if there is no edge for the third network;
determining whether there is an edge for the fourth network;
taking the fourth network device as the start network device, if there is at least one edge for the fourth network, and repeating the above steps to create a new routing path; and
terminating the process if there is no edge for the fourth network.

3. The method as claimed in claim 1, wherein the selecting step further comprises:
rendering the second routing path if the total length of the second routing path is greater than the first preset value; and
taking the current network device as the start network device and repeating the above steps to creating another routing path.

4. The method as claimed in claim 1, the selecting step further comprises:
rendering the second routing path if there is no edge with its differential value less than the second preset value for the third network.

5. The method as claimed in claim 1, further comprising:
if there are at least two edges with their differential values greater than the second preset value for the third network, randomly selecting and adding one of the edges to the second routing path.

6. The method as claimed in claim 1, further comprising:
implementing quantization to network data of the edges to obtain the network state scores based on multiple factors.

7. The method as claimed in claim 1, further comprising:
creating the routing paths of the network topology using a Snake algorithm.

8. A controller, comprising:
at least one processor;
a non-transitory storage system; and
one or more programs that are stored in the storage system and executed by the at least one processor, the one or more programs comprising instructions for:
linking multiple network devices residing in a network topology to form multiple edges;
implementing quantization to network data of the edges to obtain network state scores;
converting the network state scores to check frequency levels (CFLs) corresponding to the edges;
selecting a first network device comprising the maximum connected edges as a start network device and creating multiple routing paths comprise at least one first routing path, wherein the first routing path comprises multiple first network devices from the network devices and multiple first edges from the edges;
calculating routing frequency of the first routing path according to first CFLs of the first edges;
inferring a policy flow based on the first routing path and the OpenFlow protocol using a pathChirp algorithm and applying the policy flow to the first network devices;
transmitting a probe packet on the first routing path and adding timestamps to the probe packet by the first network devices;
returning the probe packet to the controller via the last network device;
collecting probe packets returned along the first routing path and analyzing the probe packets to obtain health states of the first routing path for network data update;
selecting a second network device comprising the maximum connected edges;
selecting a second edge from the edges connected to the second network as a start edge and moving to a third network device; wherein a second CFL of the second edge is less than a specific value, wherein the second edges is added to form a second routing path;
determining whether the third device comprises any edge;
determining whether the total length of the second routing path is less than or equal to a first preset value when the third device comprises at least one edge;
calculating CFLs of unused edges of the third network device, if the total length of the second routing path is less than or equal to the first preset value, and calculating differential values between the CFLs of the unused edges and the CFL of a selected edge connecting the third network device and the network device prior to the third network device;
determining whether there is an edge with its differential value less than a second preset value for the third network;
if there is a third edge with its differential value less than the second preset value for the third network, adding the third edge to the second routing path and moving to a fourth network device; and
repeating the above steps until there is no edge with its differential value less than the second preset value or the total length of the second routing path is greater than the first preset value, and rendering the second routing path.

9. The controller as claimed in claim 8, further comprising instructions for:
performing a recall process to discover a fourth network device if there is no edge for the third network;
determining whether there is an edge for the fourth network;
taking the fourth network device as the start network device, if there is at least one edge for the fourth network, and repeating the above steps to create a new routing path; and
terminating the process if there is no edge for the fourth network.

10. The controller as claimed in claim 8, further comprising instructions for:
rendering the second routing path if the total length of the second routing path is greater than the first preset value; and
taking the current network device as the start network device and repeating the above steps to creating another routing path.

11. The controller as claimed in claim 8, further comprising instructions for:

rendering the second routing path if there is no edge with its differential value less than the second preset value for the third network.

12. The controller as claimed in claim 8, further comprising instructions for:
   if there are at least two edges with their differential values greater than the second preset value for the third network, randomly selecting and adding one of the edges to the second routing path.

13. The controller as claimed in claim 8, further comprising instructions for:
   implementing quantization to network data of the edges to obtain the network state scores based on multiple factors.

14. The controller as claimed in claim 8, further comprising instructions for:
   creating the routing paths of the network topology using a Snake algorithm.

15. The controller as claimed in claim 8, further comprising instructions for:
   sequentially transmitting a first probe packet to each of fifth network devices residing on the first routing path;
   adding fifth timestamps representing packet visit time sessions to the first probe packet via each of the fifth network devices; and
   returning the probe packet to the controller via the last one of the fifth network device residing on the first routing path.

* * * * *